(12) United States Patent
Sun (10) Patent No.: US 6,226,535 B1
(45) Date of Patent: May 1, 2001

(54) CELLULAR TELEPHONE WITH AN IMPROVED LCD SUPPORTING FRAME

(75) Inventor: Chin-Kai Sun, Taipei Hsien (TW)

(73) Assignee: Acer Peripherals. Inc., Taoyuan (TW)

( * ) Notice: Subject to any disclaimer, the term of this patent is extended or adjusted under 35 U.S.C. 154(b) by 0 days.

(21) Appl. No.: 09/293,967

(22) Filed: Apr. 19, 1999

(30) Foreign Application Priority Data

Sep. 21, 1998 (TW) .................................. 87115724

(51) Int. Cl.[7] ...................................... A04B 1/38
(52) U.S. Cl. ..................... 455/566; 455/95; 455/575
(58) Field of Search ............................. 455/566, 575, 455/90, 95, 414

(56) References Cited

U.S. PATENT DOCUMENTS

| | | | |
|---|---|---|---|
| 4,642,627 | * 2/1987 | Hodson et al. | 340/765 |
| 5,204,805 | * 4/1993 | Takahashi et al. | 361/386 |
| 5,410,141 | * 4/1995 | Koeck et al. | 361/383 |
| 5,517,683 | * 5/1996 | Collett et al. | 455/89 |
| 5,711,013 | * 1/1998 | Collett et al. | 455/558 |
| 5,867,795 | * 2/1999 | Novis et al. | 455/566 |
| 5,966,647 | * 10/1999 | Sawai | 455/300 |
| 6,006,118 | * 12/1999 | Stephenson | 455/575 |

* cited by examiner

*Primary Examiner*—Daniel Hunter
*Assistant Examiner*—Thuan T. Nguyen
(74) *Attorney, Agent, or Firm*—Winston Hsu (57) ABSTRACT

The present invention provides a cellular telephone with an auxiliary circuit board having a light source and a volume control module and comprising a horizontal main circuit board, an LCD (liquid crystal display) panel, a supporting frame, an auxiliary circuit board with a light source, a light guiding panel, and a zebra connector. In the production of the cellular telephone, no complicated soldering is required. In addition, the number of components are reduced and the general structure is improved and simplified.

6 Claims, 8 Drawing Sheets

CELLULAR TELEPHONE WITH AN IMPROVED LCD SUPPORTING FRAME

BACKGROUND OF THE INVENTION

1. Field of the Invention

The present invention relates to a cellular telephone, and more particularly, to a cellular telephone with an improved LCD supporting frame.

2. Description of the Prior Art

Typically, the LCD panel of a cellular telephone is supported horizontally above the main circuit board by a supporting frame. An auxiliary circuit board with a light source is installed vertically at one end of the supporting frame and a light guiding panel is installed horizontally on the supporting frame for passing light emitted from the light source upward onto the LCD panel as backlight. The auxiliary circuit board is soldered onto the main circuit board thus fixing it to the supporting frame and allowing inward passage of current. The contacting surface and soldering area of the auxiliary circuit board and main circuit is small and there is no room to install any circuits other than a simple light source circuit. The soldering area is further limited during installation of the supporting frame and auxiliary circuit board onto the main circuit board due to the complexity of the cellular telephone. Installing the supporting frame and auxiliary circuit board is not an easy task.

SUMMARY OF THE INVENTION

It is therefore a primary objective of the present invention to provide a cellular telephone with an auxiliary circuit board having a light source and a peripheral circuit to solve the mentioned problem.

In a preferred embodiment, the present invention provides a cellular telephone comprising:

a housing;
  a main circuit board horizontally installed in the housing and comprising a first surface connector having a plurality of metal conductors installed on an upper surface of the main circuit board;
  an LCD (liquid crystal display) panel installed above the main circuit board for displaying images;
  a supporting frame latched to the main circuit board for supporting the LCD panel above the upper surface of the main circuit board;
  an auxiliary circuit board vertically installed at one end of the supporting frame having a light source, a peripheral circuit, and a second surface connector in it, the second surface connector comprising a plurality of metal conductors corresponding to the metal conductors of the first surface connector, the second surface connector being electrically wired to the light source and the peripheral circuit on the auxiliary circuit board;
  a light guiding panel horizontally mounted between the LCD panel and the supporting frame for passing light emitted from the light source upward onto the LCD panel so as to provide backlight to the LCD panel; and
  an elongated zebra connector horizontally mounted to a bottom side of the supporting frame and comprising a bottom side and an elongated vertical side.

It is an advantage of the present invention that the cellular telephone according to the present invention solves the soldering problem by facilitating the combination of components. At the same time, it reduces the number of components and simplifies the general structure of the cellular telephone.

This and other objectives of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
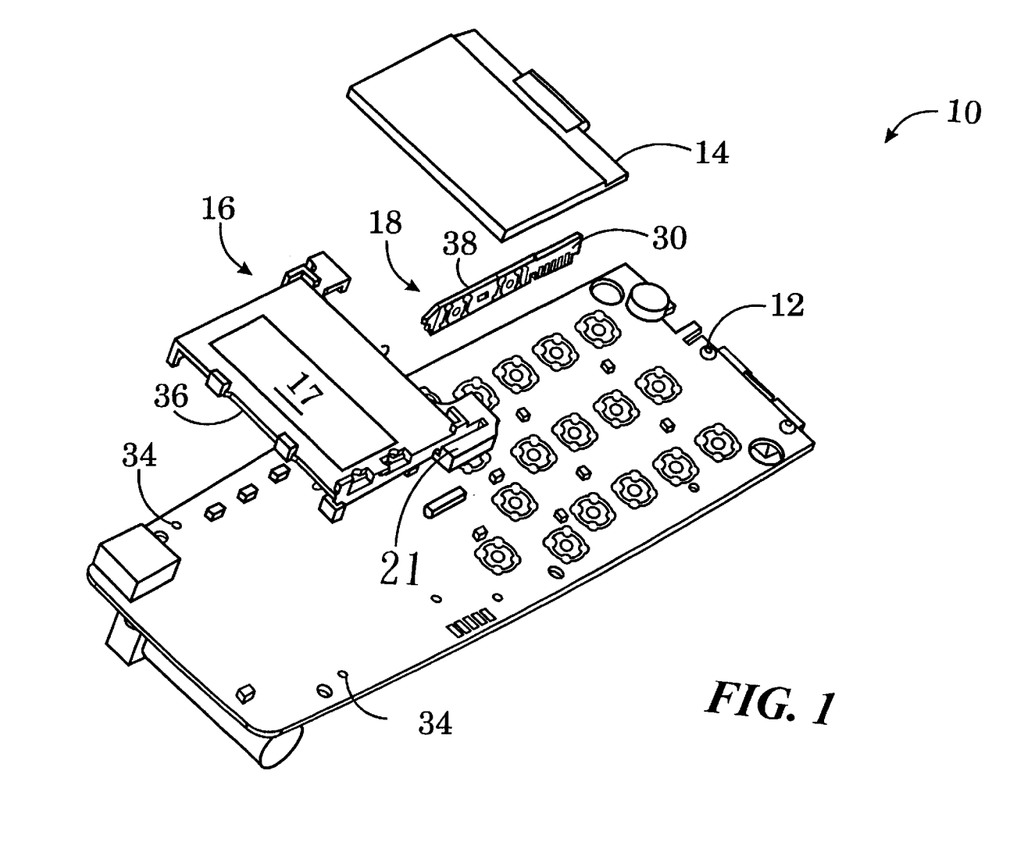
FIG. 1 shows the components of a cellular telephone according to the present invention.
Figure 2:
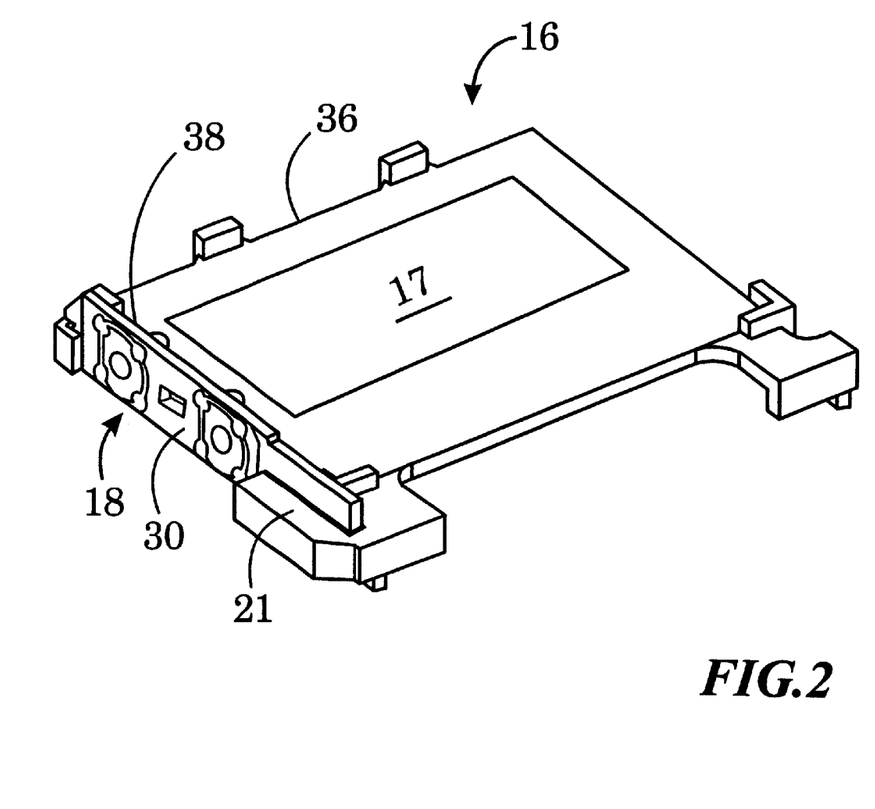
FIG. 2 is a perspective view of the auxiliary circuit board installed at one end of the supporting frame.
Figure 3:
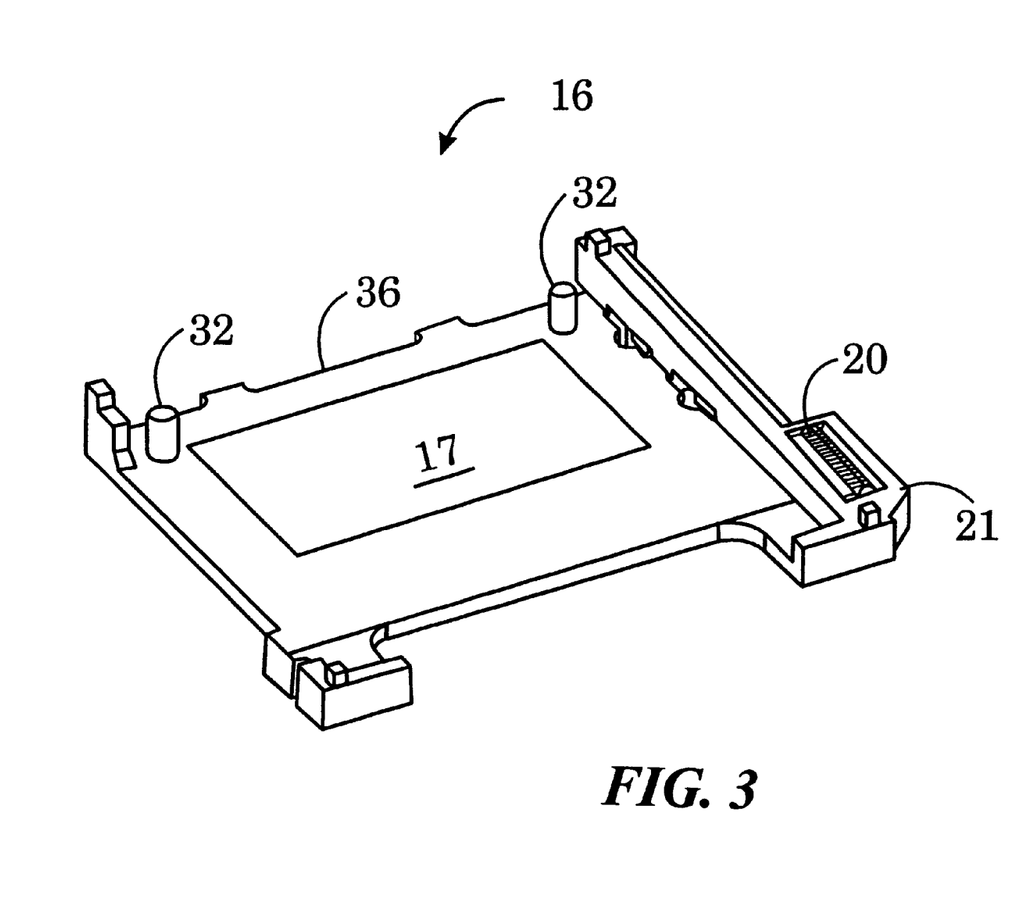
FIG. 3 is a perspective view of the zebra connector mounted to a bottom side of the supporting frame.

Please refer to FIGS. 1 to 3. FIG. 1 shows the components of a cellular telephone 10 according to the present invention. FIG. 2 is a perspective view of the auxiliary circuit board 18 installed at one end of the supporting frame 16. FIG. 3 is a perspective view of the zebra connector 20 mounted to the bottom side of the supporting frame 16. The cellular telephone 10 comprises an upper chassis (not shown), a lower chassis (not shown), a main circuit board 12 horizontally installed in the lower chassis, an LCD (liquid crystal display) panel 14 installed above the main circuit board 12 for displaying images, a supporting frame 16 latched to the main circuit board 12 for supporting the LCD panel 14 above the upper surface of the main circuit board 12, an auxiliary circuit board 18 vertically installed at one end of the supporting frame 16 having a light source (not shown) and a volume control module 30, a light guiding panel 17 horizontally mounted between the LCD panel 14 and the supporting frame 16 for passing light emitted from the light source upward onto the LCD panel 14 so as to provide backlight to the LCD panel 14, an elongated zebra connector 20 horizontally mounted to the bottom side of the supporting frame 16, and a supporting base 21 for supporting the zebra connector 20. The auxiliary circuit board 18 comprises two vertical sides with a light source installed at the side facing the supporting frame 16 and a volume control module 30 installed on the other side for controlling the volume of the cellular telephone 10.

Figure 4:
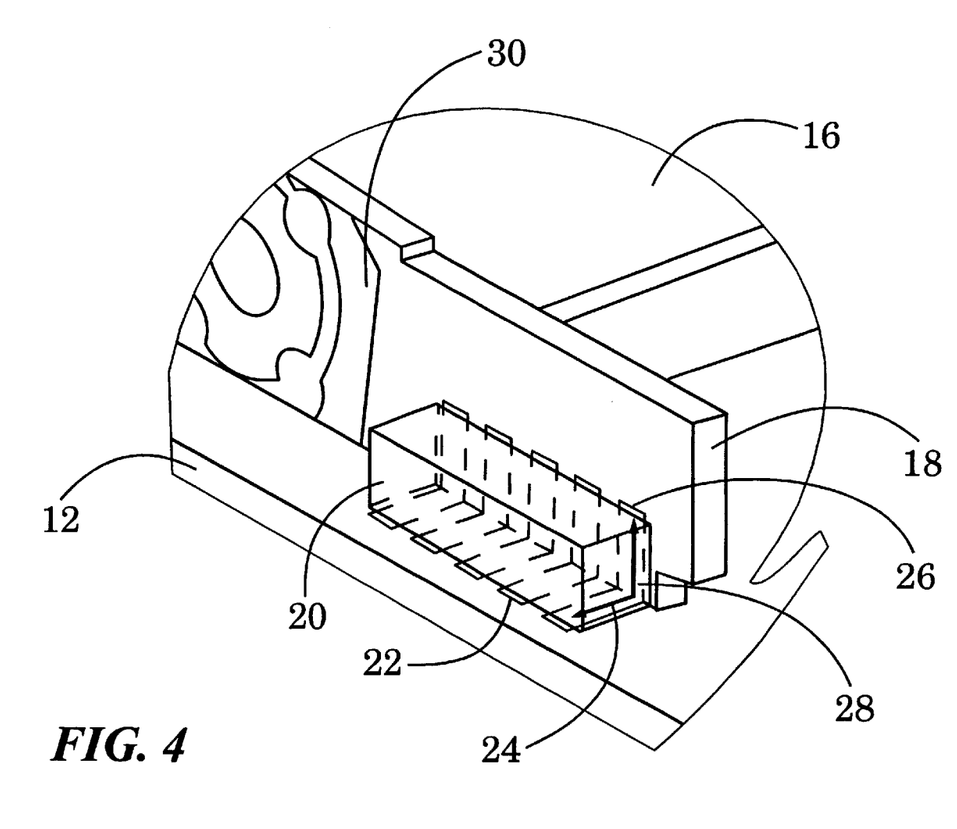
FIG. 4 is a perspective diagram of the zebra connector shown in FIG. 1.

Please refer to FIG. 4. FIG. 4 is a perspective diagram of the zebra connector 20 shown in FIG. 1. The main circuit board 12 comprises a first surface connector 22 having a plurality of metal conductors 24 on its upper surface. The auxiliary circuit board 18 has a second surface connector 26 which comprises a plurality of metal conductors 28 corresponding to the metal conductors 24 of the first surface connector 22 and is electrically wired to the light source and the volume control module 30. The zebra connector 20 contacts the first surface connector 22 with its bottom surface and also contacts the second surface connector 26 with one of its sides. It is made of conductive rubber.

Figure 5:
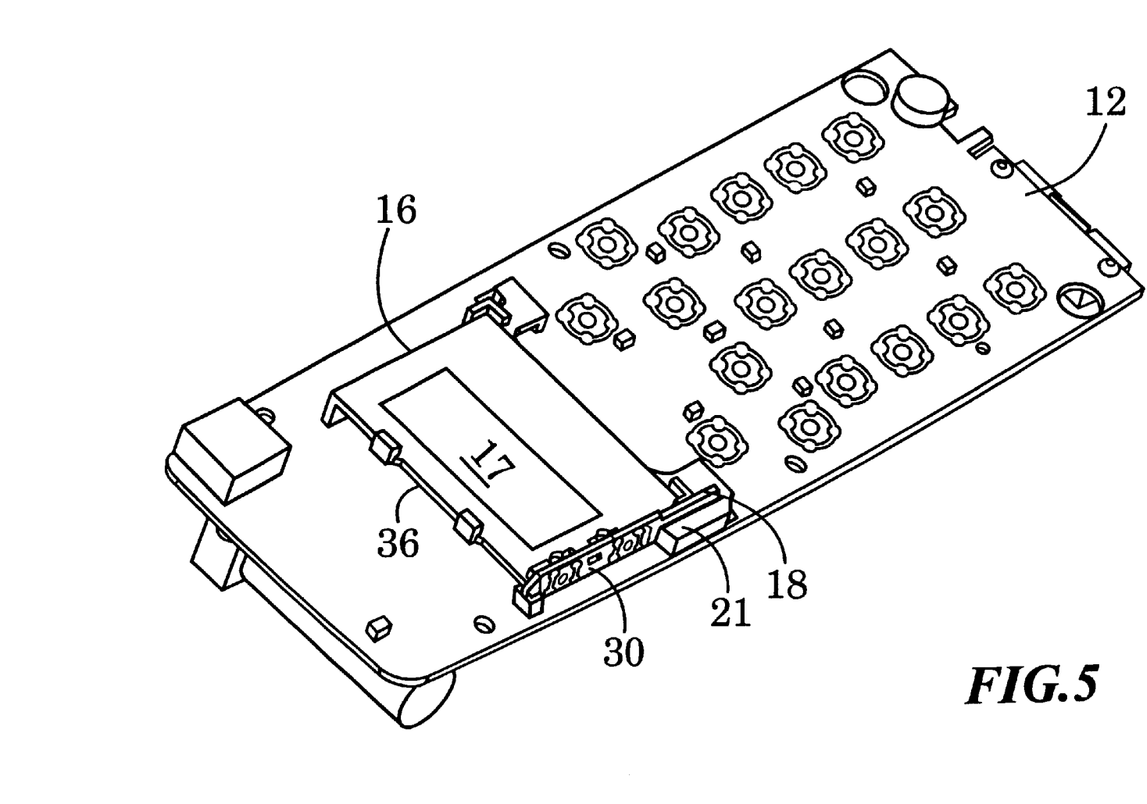
FIG. 5 is a perspective view of the supporting frame latched to the main circuit board.
Figure 6:
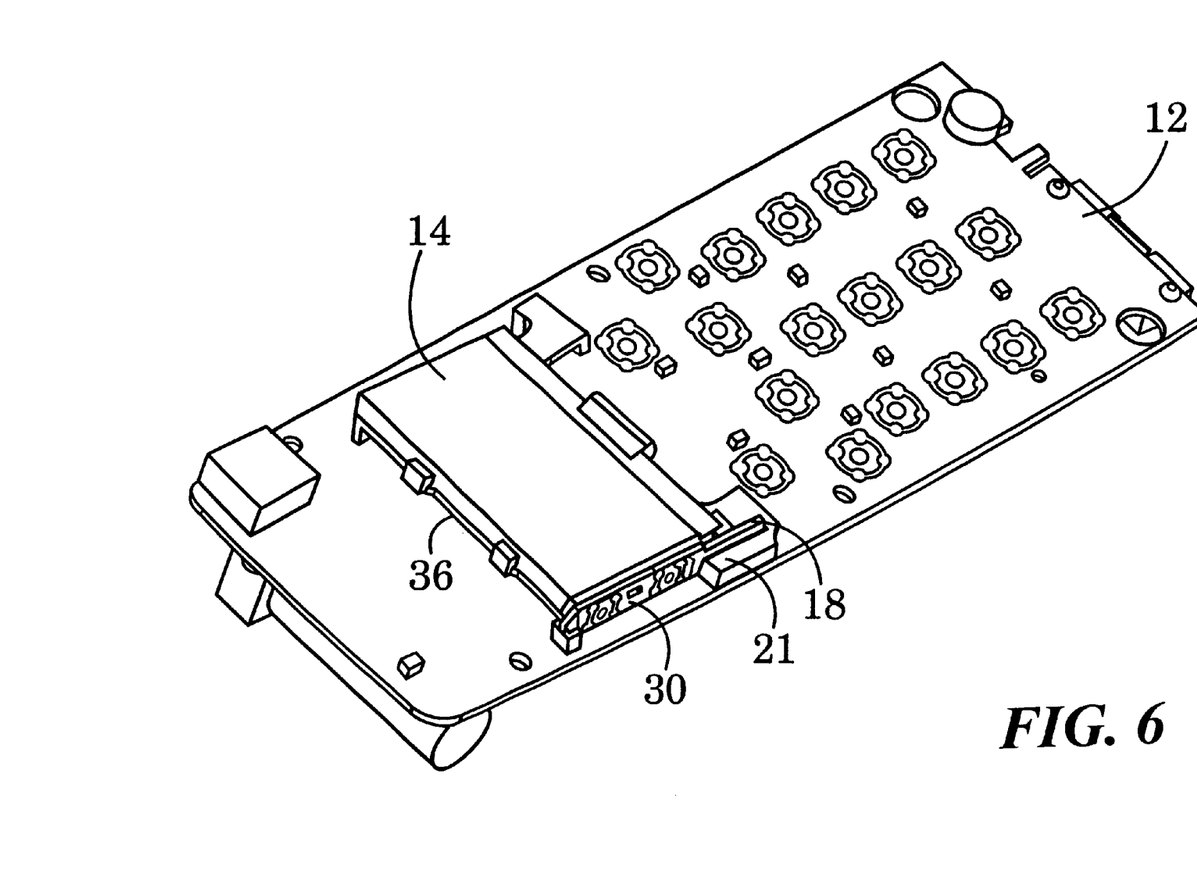
FIG. 6 is a perspective view of the LCD panel installed above the supporting frame.

Please refer to FIGS. 5 and 6. FIG. 5 is a perspective view of the supporting frame 16 latched to the main circuit board 12. FIG. 6 is a perspective view of the LCD panel 14 installed above the supporting frame 16. When the upper and lower chassis of the cellular telephone 10 are attached, the LCD panel 14, supporting frame 16 and main circuit board 12 will be clamped in sequence between the upper and lower chassis. The auxiliary circuit board 18 is fixed onto the main circuit board 12 while the supporting base is pressed downward, pressing the zebra connector 20 and bringing it in close contact with the first surface connector 22 and second surface connector 26. The electrical connection between the corresponding metal conductors 24 and 28 of the first 22 and second surface connectors 26 can thus be maintained.

As shown in FIG. 3, the bottom of the supporting frame 16 comprises two protruding knobs 32 installed at the two ends of the side 36. As shown in FIG. 1, the main circuit board 12 has two through holes 34 corresponding to the two protruding knobs 32 so that the two protruding knobs 32 of the supporting frame 16 can be inserted into the two corresponding through holes on the main circuit board 12. Because only one side 36 is fixed to the main circuit board 12, the inner (non-fixed) side of the upper chassis has to match the upper side 38 of the auxiliary circuit board 18. Thus, when the upper and lower chassis are connected, the supporting frame 16 and auxiliary circuit board 18 can be fixed to the main circuit board 12. Also, the zebra connector 20 is in close contact with the first and second surface connector 22, 26 so that the electrical connection between the corresponding metal conductors 24, 28 can be maintained.

Figure 7:
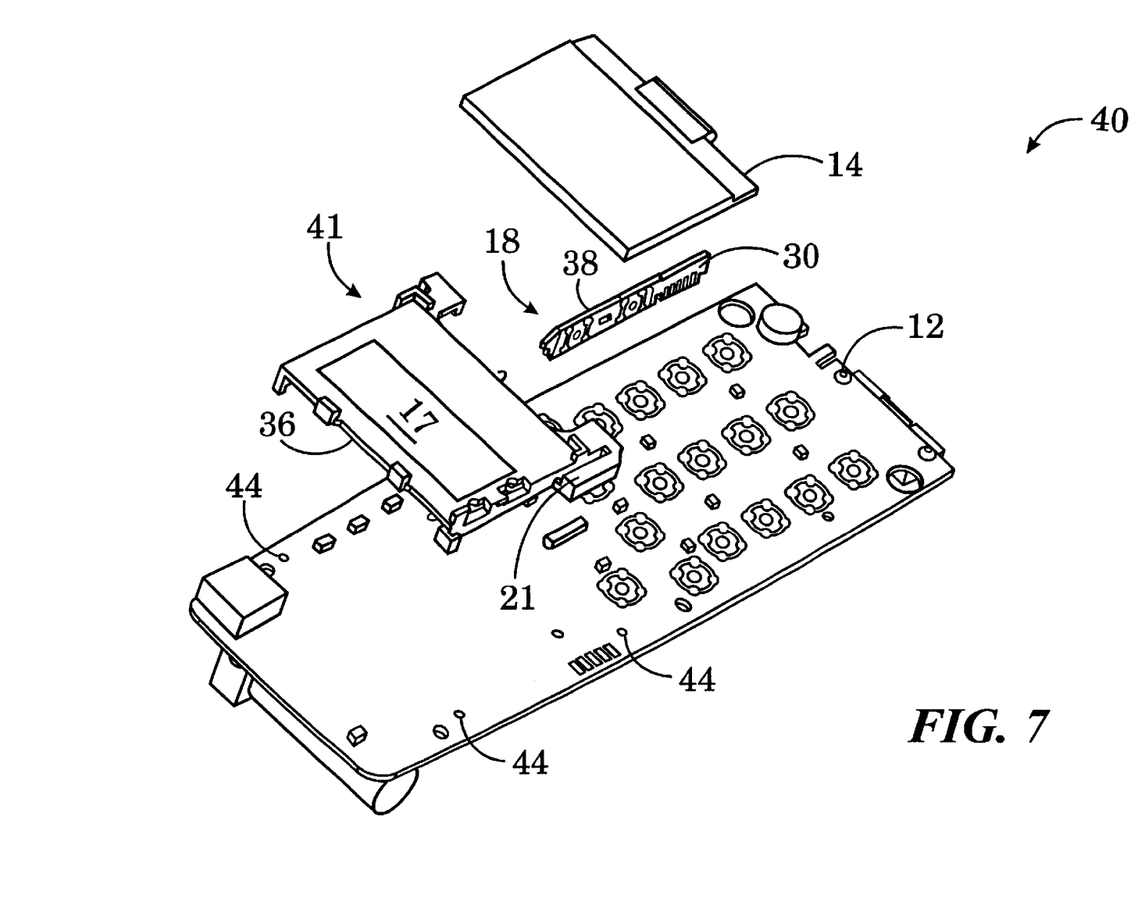
FIG. 7 shows the components of another cellular telephone according to the present invention.
Figure 8:
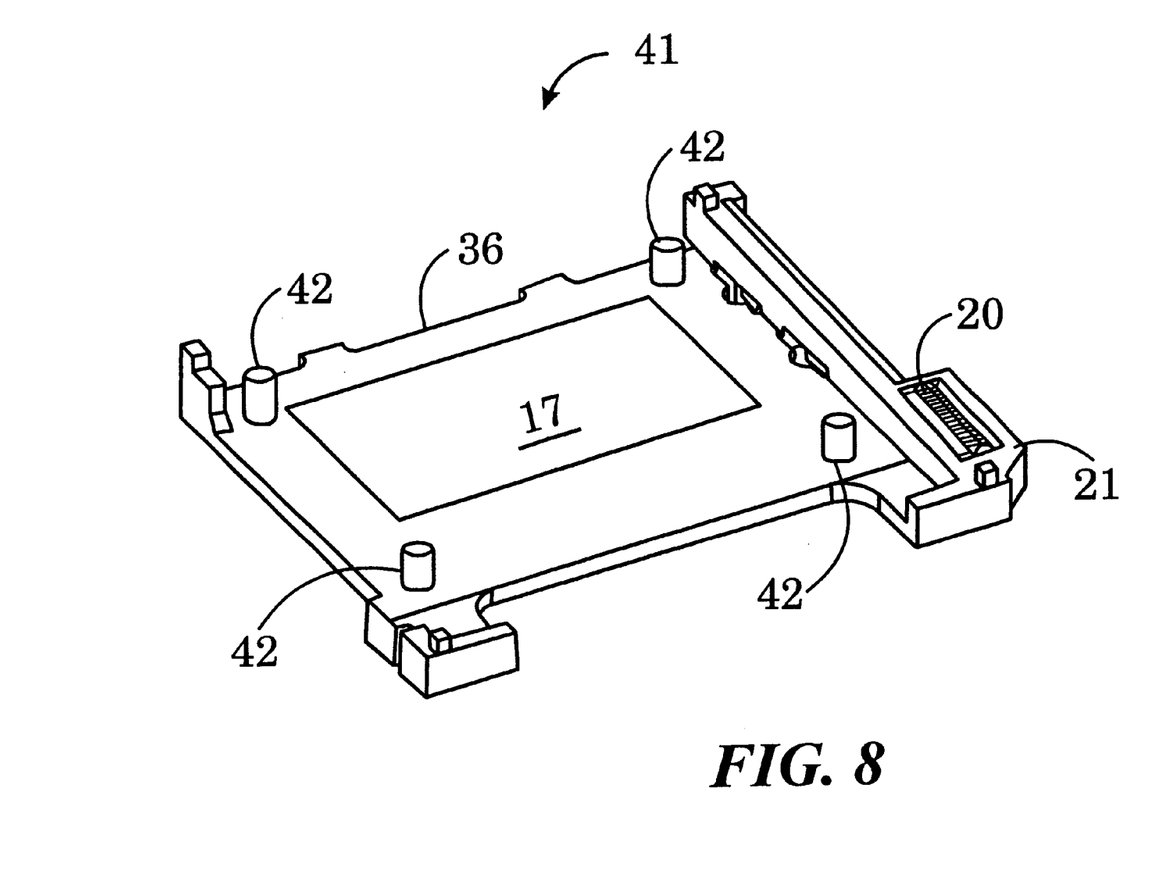
FIG. 8 is a perspective view of the supporting frame shown in FIG. 7.

Please refer to FIG. 7 and FIG. 8. FIG. 7 shows the components of another cellular telephone 40 according to the present invention. FIG. 8 is a perspective view of the supporting frame 41 shown in FIG. 7. The bottom of the supporting frame 41 comprises four protruding knobs 42, and four corresponding through holes 44 installed on the main circuit board 12. The four protruding knobs 42 of the supporting frame 41 are inserted into the four corresponding through holes 44 on the main circuit board 12 to fix the supporting frame 41 to the main circuit board 12 and to bring the zebra connector 20 in close contact with the first surface connector 22 of the main circuit board 12. Using this design, the supporting frame 41 can be firmly fixed to the main circuit board 12 without pressing the auxiliary circuit board 18 with the upper chassis. Thus, the design of the upper chassis of the cellular telephone 40 is simpler, and it is easier to fix the upper and lower chassis together.

In contrast to the prior art cellular telephone, in the present invention, the light source and volume control module 30 of the cellular telephone 10, 40 are installed on two sides of the auxiliary circuit board 18 which is secured to the supporting frame 16, 41 thus optimizing the positioning effect of the light source and volume control module 30. Also, electricity is conducted between the main circuit board 12 and the auxiliary circuit board 18 by the zebra connector 20 which has the capability of conducting to vertically neighboring surfaces. If the design of the peripheral circuit of the auxiliary circuit board is to be changed to increase functionality of the cellular telephone 10, 40, the number of metal conductors 24,28 is simply increased. Therefore, The cellular telephone of the present invention facilitates the combination of components, reduces the number of components, simplifies the structure of the telephone and does not require soldering.

Those skilled in the art will readily observe that numerous modifications and alterations of the device may be made while retaining the teachings of the invention. Accordingly, the above disclosure should by construed as limited only by the metes and bounds of the appended claims.

What is claimed is:

1. A cellular telephone comprising:

a housing;

a main circuit board horizontally installed in the housing and comprising a first surface connector having a plurality of metal conductors installed on an upper surface of the main circuit board;

an LCD (liquid crystal display) panel installed above the main circuit board for displaying images;

a supporting frame latched to the main circuit board for supporting the LCD panel above the upper surface of the main circuit board;

an auxiliary circuit board vertically installed at one end of the supporting frame having a light source, a peripheral circuit, and a second surface connector in it, the second surface connector comprising a plurality of metal conductors corresponding to the metal conductors of the first surface connector, the second surface connector being electrically wired to the light source and the peripheral circuit on the auxiliary circuit board;

a light guiding panel horizontally mounted between the LCD panel and the supporting frame for passing light emitted from the light source upward onto the LCD panel so as to provide backlight to the LCD panel; and an elongated zebra connector horizontally mounted to a bottom side of the supporting frame and comprising a bottom side and an elongated vertical side;

wherein the bottom side of the zebra connector is in contact with the first surface connector, and the elongated vertical side of the zebra connector is in contact with the second surface connector so that each of the corresponding metal conductors of the first and second surface connectors are electrically connected.

2. The cellular telephone of claim 1 wherein the housing comprises an upper chassis and a lower chassis, when the upper and lower chassis are fixed together, the LCD panel, supporting frame and main circuit board are clamped in sequence between the upper and lower chassis, and the zebra connector is closely clamped between the supporting frame and the first surface connector on the main circuit board so that electrical connection between the corresponding metal conductors of the first and second surface connectors can be maintained.

3. The cellular telephone of claim 1 wherein the vertically installed auxiliary circuit board comprises two vertical sides over which the light source is installed at one vertical side facing the light guiding panel and the peripheral circuit is installed on the other vertical side.

4. The cellular telephone of claim 1 wherein the zebra connector is clamped in a recess on the bottom side of the supporting frame and one side of the recess is formed by the second surface connector of the auxiliary circuit board wherein the zebra connector is forced to closely contact the second surface connector in the recess.

5. The cellular telephone of claim 1 wherein the peripheral circuit of the auxiliary circuit board is a volume control module for controlling speaker volume of the cellular telephone.

6. The cellular telephone of claim 1 wherein the bottom of the supporting frame comprises four protruding knobs which are latched into four corresponding through holes on the main circuit board wherein the supporting frame is fixed to the main circuit board by using the four protruding knobs and the zebra connector is clamped between the supporting frame and the first surface connector on the main circuit board for maintaining electric connection between the first and second surface connectors.

* * * * *